United States Patent
Yu

(10) Patent No.: US 6,451,644 B1
(45) Date of Patent: *Sep. 17, 2002

(54) METHOD OF PROVIDING A GATE CONDUCTOR WITH HIGH DOPANT ACTIVATION

(75) Inventor: Bin Yu, Fremont, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/187,618

(22) Filed: Nov. 6, 1998

(51) Int. Cl.[7] .......................................... H01L 21/8234
(52) U.S. Cl. ..................... 438/230; 438/197; 438/595
(58) Field of Search ................................. 438/535, 488, 438/585, 587, 487, 197, 230, 590, 592, 595

(56) References Cited

U.S. PATENT DOCUMENTS

| 3,940,289 A | * 2/1976 | Marquardt et al. ........... 148/1.5 |
| 4,063,967 A | * 12/1977 | Graul et al. .................... 148/1.5 |
| 4,343,832 A | * 8/1982 | Smith et al. ................ 427/53.1 |
| 4,364,778 A | * 12/1982 | Leamy et al. ................. 148/1.5 |
| 4,646,426 A | * 3/1987 | Sasaki ........................... 29/571 |
| 4,683,645 A | * 8/1987 | Naguib et al. ............... 438/301 |
| 4,916,090 A | * 4/1990 | Motai et al. .................. 438/535 |
| 5,316,969 A | * 5/1994 | Ishida et al. ................. 438/535 |
| 5,346,850 A | * 9/1994 | Kaschmitter et al. ........ 438/487 |
| 5,508,209 A | * 4/1996 | Zhang et al. ................. 438/162 |
| 5,576,556 A | * 11/1996 | Takemura et al. ............. 257/69 |
| 5,591,653 A | * 1/1997 | Sameshima et al. ......... 438/487 |
| 5,623,157 A | * 4/1997 | Miyazaki et al. ............ 257/383 |
| 5,644,147 A | * 7/1997 | Yamazaki et al. ............. 257/66 |
| 5,648,277 A | * 7/1997 | Zhang et al. ................. 438/151 |
| 5,719,065 A | * 2/1998 | Takemura et al. ........... 438/163 |
| 5,767,004 A | * 6/1998 | Balasubramanian et al. ............................ 438/197 |
| 5,798,744 A | * 8/1998 | Tanaka et al. .................. 345/92 |
| 5,804,878 A | * 9/1998 | Miyazaki et al. ............ 257/764 |
| 5,817,550 A | * 10/1998 | Carey et al. ................. 438/166 |
| 5,818,070 A | * 10/1998 | Yamazaki et al. ............. 257/72 |
| 5,882,962 A | * 3/1999 | Tseng et al. ................. 438/587 |
| 5,945,711 A | * 8/1999 | Takemura et al. ........... 257/344 |
| 5,962,872 A | * 10/1999 | Zhang et al. .................. 257/66 |
| 5,962,897 A | * 10/1999 | Takemura et al. ........... 257/347 |
| 6,127,216 A | 10/2000 | Yu .............................. 438/238 |

OTHER PUBLICATIONS

S. L. Wu et al., Suppression of the Boron Penetration Induced Si/SiO2 Interface Degradation by Using a Stacked–Amorphous–Silicon Film as the Gate Structure for pMOSFET. 1994, IEEE, pp. 160–162.*

B. Yu et al., CMOS Transistor Reliability and Performance Impacted by Gate Microstructure. 1997, IEEE, pp. 35–41.*

J. Yi et al., Amorphous and Micro–Crystalline Silicon for Photovoltaic Application. 1993, IEEE, pp. 977–980.*

* cited by examiner

Primary Examiner—Olik Chaudhuri
Assistant Examiner—Anh Duy Mai
(74) Attorney, Agent, or Firm—Foley & Lardner

(57) ABSTRACT

An ultra-large scale integrated (ULSI) circuit includes MOSFETs which have a gate conductor with dopants distributed in a box-like distribution. The dopants also achieve high electrical activation. The MOSFETs utilize gate structures with heavily doped polysilicon material or heavily doped polysilicon and germanium material. The polysilicon and polysilicon and germanium materials are manufactured by utilizing amorphous semiconductor layers. Excimer laser annealing is utilized to activate the dopants and to provide a box-like dopant profile.

20 Claims, 2 Drawing Sheets

METHOD OF PROVIDING A GATE CONDUCTOR WITH HIGH DOPANT ACTIVATION

CROSS REFERENCE TO RELATED APPLICATIONS

This application is related to U.S. patent application Ser. No. 09/187,881, filed on an even date herewith by Yu, entitled "Heavily-Doped Polysilicon/Germanium Thin Film Formed by Laser Annealing." U.S. Pat. No. 6,127,216.

FIELD OF THE INVENTION

The present invention relates generally to an integrated circuit (IC) and the fabrication of an integrated circuit. More particularly, the present invention relates to an integrated circuit having gate electrode material which is highly activated.

BACKGROUND OF THE INVENTION

Ultra-large scale integrated (ULSI) circuits generally include a multitude of transistors, such as, more than one million transistors and even several million transistors on a substrate. The transistors are generally metal oxide semiconductor field effect transistors (MOSFETs), which include a gate conductor disposed between a source region and a drain region. The gate conductor is provided over a thin gate oxide material.

Generally, the gate conductor is a polysilicon or polysilicon/ germanium ($Si_xGe_{(1-x)}$) material that controls charge carriers in a channel region between the drain and the source to turn the transistor on and off. The transistors can be N-channel MOSFETs or P-channel MOSFETs.

The polysilicon and polysilicon/germanium gate materials are heavily doped (e.g., P+ or N+) to increase their conductivity. According to conventional processes, the dopant implant projection is positioned at one-half the depth of the gate material (i.e., gate electrode) thickness to reduce the possibility of dopant diffusion through the thin gate oxide into the channel. Dopant diffusion through the thin gate oxide can adversely affect the predictability of the design and the operability of the circuit.

In conventional processes, dopant distribution in the gate material has a Gaussian-like profile (i.e., the dopant concentration is greatest in the center of the gate material). Accordingly, the dopant concentration near the gate electrode/gate oxide interface is relatively low. The relatively low dopant concentration near the gate electrode and gate oxide interface is referred to as "gate-depletion effect" and is a major problem in complementary MOS (CMOS) processes which manufacture small scale transistors.

Conventional processes for fabricating transistors have a limited thermal budget so shallow junctions can be effectively formed. Shallow junctions are necessary for appropriate transistor size in ULSI circuits. Dopant implanted into the gate material is often not sufficiently activated due to the limited thermal budget. The low electrically activated dopant concentration near the gate material/gate oxide interface, combined with the gate depletion effect, causes higher resistance in the polysilicon or polysilicon/germanium gate material. The higher resistance results in a greater voltage drop between the center of the gate electrode/gate oxide. The greater voltage drop causes a loss of effective voltage bias, which in turn degrades MOSFET drive current and speed, and which also increases the power consumed by the transistor.

Thus, there is a need for a process that can manufacture a gate conductor having a box-like dopant profile and achieve high dopant activation. Further still, there is a need for a gate conductor that has a relatively low thermal budget and is not susceptible to gate-depletion effect. Further still, there is a need for a polysilicon/germanium gate conductor that can be efficiently manufactured.

SUMMARY OF THE INVENTION

The present invention relates to a method of manufacturing an integrated circuit. The method includes providing an amorphous semiconductor layer over a dielectric layer, doping the amorphous semiconductor layer, providing a silicide layer over the amorphous semiconductor layer, and annealing the amorphous semiconductor layer to form a crystallized semiconductor layer. Dopants are distributed in the crystallized semiconductor layer in a box-like profile.

The present invention also relates to a method of manufacturing an ultra-large scale integrated circuit including field effect transistors disposed on a semiconductor substrate. Each of the transistors has a gate structure with a gate conductor having a box-like dopant profile. The method includes steps of providing an amorphous silicon layer over a dielectric layer disposed over the substrate, doping the amorphous silicon layer, providing a silicide layer over the amorphous silicon layer, etching the dielectric layer, the amorphous silicon layer, and the silicide layer to form preliminary gate structures, providing nitride spacers for the preliminary gate structures, and laser annealing the amorphous semiconductor layer.

The present invention even further relates to a method of providing a gate structure with a gate conductor having a box-like dopant profile. The method includes providing an amorphous layer over a gate dielectric layer disposed over a substrate, doping the amorphous layer, providing a silicide layer over the amorphous layer, selectively etching the gate dielectric layer, the amorphous layer, and the metal semiconductor layer to form a gate stack, providing spacers for the gate stack, and laser annealing the amorphous layer.

BRIEF DESCRIPTION OF THE DRAWINGS

The present invention will hereafter be described with reference to the accompanying drawings, wherein like numerals denote like elements, and.

DETAILED DESCRIPTION OF THE PREFERRED EMBODIMENTS

Figure 1:
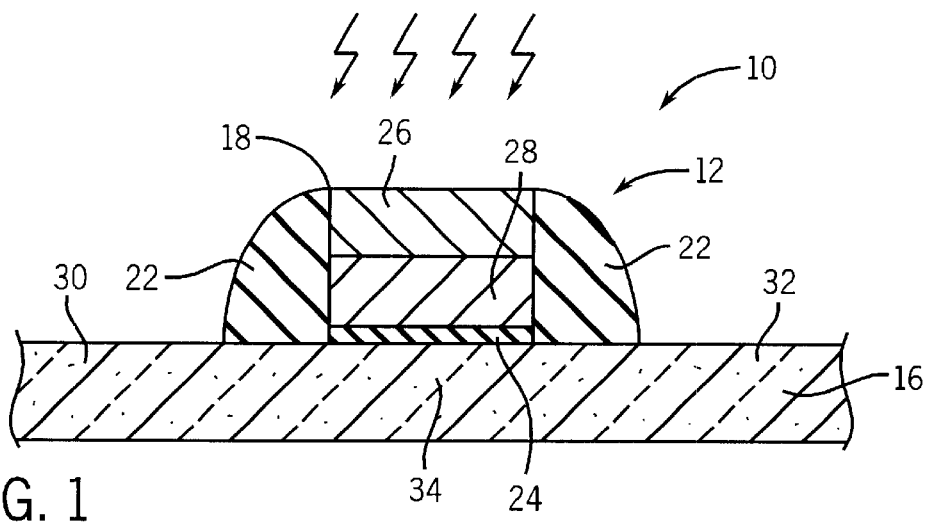
FIG. 1 is a cross-sectional view of a portion of an integrated circuit in accordance with an exemplary embodiment of the present invention.

With reference to FIG. 1, a portion 10 of an integrated circuit (IC) or chip includes a transistor 12. Portion 10 is preferably part of an ultra-large-scale integrated (ULSI) circuit having 1,000,000 or more transistors. Portion 10 is manufactured as part of the IC on a semiconductor wafer, such as, a silicon wafer.

Transistor 12 is disposed on a substrate 16 that is preferably silicon. Alternatively, substrate 16 can be any suitable semiconductor material. Transistor 12 includes a gate stack 18, which includes sidewall spacers 22, a gate dielectric 24, a metal semiconductor layer 26, and a polysilicon layer 28.

Spacers 22 and dielectric 24 can be silicon dioxide, nitride, or other insulating material. Spacers 22 are preferably nitride ($Si_3N_4$) formed by depositing a nitride layer and selectively etching the nitride layer. The nitride layer can be deposited by chemical vapor deposition (CVD). Dielectric 24 is preferably a thermally grown 2–5 nm layer of silicon dioxide. Alternatively, dielectric 24 can be other insulative materials, such as, nitride.

Transistor 12 also includes a drain 30, a source 32, and a channel 34. Channel 34 of transistor 12 is disposed underneath dielectric 24 and between source 32 and drain 30. Transistor 12 can be an N-channel or a P-channel transistor.

Metal semiconductor or silicide layer 26 is preferably a silicide layer that is approximately 100–500 nanometers (nm) thick. Layer 26 is preferably directly deposited or sputtered tungsten silicide ($WSi_x$), where x is between 1 and 2. Layer 26 can be any type of silicide.

Polysilicon layer 28 is preferably 100–200 nm thick. Layer 28 preferably has a box-like dopant distribution where dopant is relatively highly dense near the gate electrode/gate oxide interface (between layers 28 and 24). Additionally, high dopant activation has been achieved in layer 28. Layer 28 can be amorphous or polysilicon a silicon/germanium layer ($Si_xGe_{(1-x)}$), a amorphous or polyoxide germanium layer, or other semiconductor layer.

Figure 2:
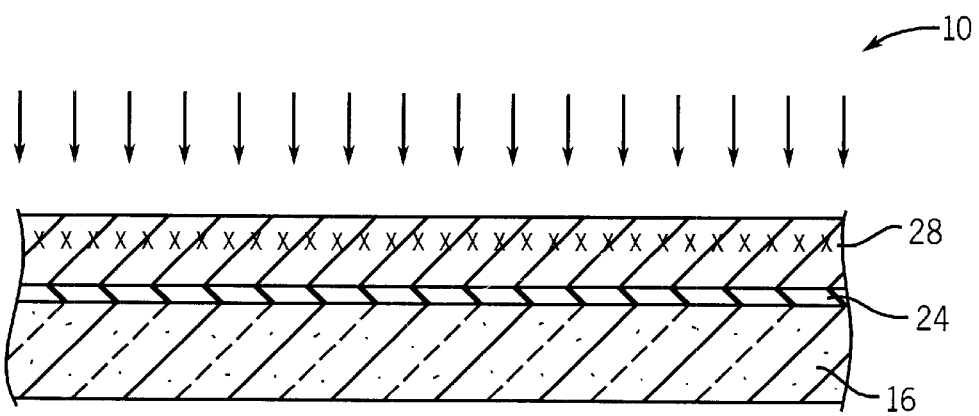
FIG. 2 is a cross-sectional view of the portion of the integrated circuit illustrated in FIG. 1, showing a gate dopant implant step.

With reference to FIGS. 1–4, the fabrication of portion 10 is described below as follows. In FIG. 2, dielectric layer 24 is thermally grown as a very thin oxide on top of substrate 16, which is silicon. Layer 28 is deposited on top of layer 24 as a 100–200 nm layer. Layer 28 can be deposited by chemical vapor deposition (CVD) or physical vapor deposition (PVD).

Layer 28 is preferably deposited in a low-temperature CVD (LTCVD) process as amorphous silicon, at a temperature below 500° C. After layer 28 is deposited, a gate dopant ion implant process is utilized to provide a chosen dopant into layer 28. The dopant is represented by the symbol x in FIGS. 2 and 3. The dopant can be arsenic, phosphorous, boron, boron diflouride, indium, or other dopant. Layer 28 can be doped in a ion implantation process, a diffusion process, or other method for providing dopants into layer 28.

Figure 3:
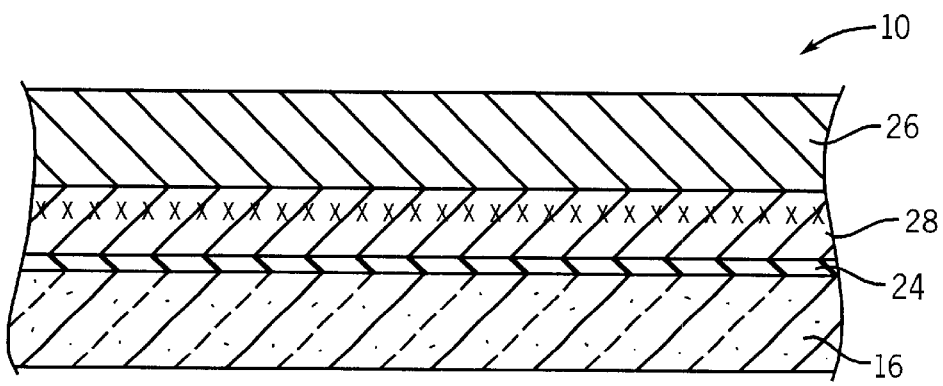
FIG. 3 is a cross-sectional view of the portion of the integrated circuit illustrated in FIG. 1, showing a silicide deposition step.

With reference to FIG. 3, layer 26 is deposited or sputtered on top of layer 28 as a 150 nm metal semiconductor (a silicide) film. Preferably, layer 26 is deposited directly as a tungsten silicide ($WSi_x$) by a CVD process. Alternatively, layer 26 can be any type of a refractory metal and silicon combination, such as, a cobalt silicide, or other silicide material. Alternatively, layer 26 can be deposited as a silicon layer and 2 refractory metal layer and then transformed to a silicide in a conventional silicidation process.

Figure 4:
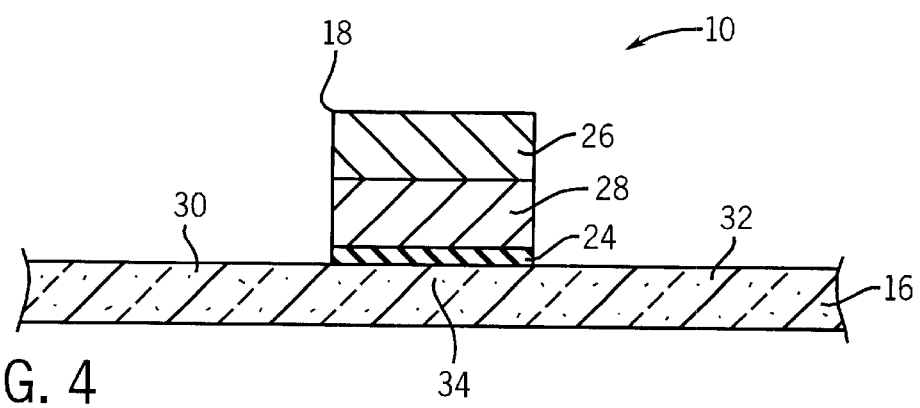
FIG. 4 is a cross-sectional view of the portion of the integrated circuit illustrated in FIG. 1, showing a gate stack etching step.

With reference to FIG. 4, layers 24, 26, and 28 are etched to form a portion of gate stack 18 on substrate 16. Layers 24, 26, and 28 can be formed by a photolithography and etching process. Layers 24 and 28 can be etched by dry-etching, wet-etching, or other removal technique.

With reference to FIG. 1, a nitride layer is provided over gate stack 18 and selectively etched to leave spacers 22. Spacers 22 are preferably provided adjacent layers 26 and 28. After spacers 22 are formed, portion 10 is thermally annealed to melt layer 28 from an amorphous silicon layer to a polysilicon layer. After melting, layer 28 is recrystallized as a polysilicon layer. Preferably, portion 10 is thermally annealed by an excimer laser process that heats layer 28 to over 800° C. Advantageously, gate stack 18 is fabricated without any gate-rounding effect during the melting of layer 28 because layer 26 and spacers 22 provide a fixed container for the melting of layer 28.

After recrystallization of layer 28, the dopant profile along the vertical direction is box-like due to the melting of layer 28. Accordingly, dopant density near the gate electrode/gate oxide interface (between layer 24 and layer 28) is higher than can be obtained from conventional ion implantation methods. In addition, high dopant activation is achieved by melting layer 28.

Alternatively, layer 28 can be an amorphous germanium layer or a combination of an amorphous germanium layer and an amorphous silicon layer that is recrystallized as a polycrystalline or as a polysilicon/germanium layer, respectively. In such a technique, gate stack 18 can have a gate conductor that includes a germ mm layer. The germanium layer could be deposited by low pressure CVD. In another alternative, layer 28 can be implanted with germanium via an ion implantation technique. For example, layer 28 can be a $Si_xGe_{(1-x)}$ layer, where x is between 0 and 1.

It is understood that while the detailed drawings, specific examples, and particular values given provide a preferred exemplary embodiment of the present invention, the preferred exemplary embodiment is for the purpose of illustration only. The method and apparatus of the invention is not limited to the precise details and conditions disclosed. For example, although particular polysilicon and silicide gate structures are described, other types can be utilized. Various changes may be made to the details disclosed without departing from the spirit of the invention, which is defined by the following claims.

What is claimed is:

1. A method of manufacturing an integrated circuit, comprising:

providing an amorphous semiconductor layer over and in contact with a dielectric layer;

doping the amorphous semiconductor layer;

providing a suicide layer over and in contact with the amorphous semiconductor layer;

etching the silicide layer and the amorphous semiconductor layer, whereby a gate structure is formed;

providing barrier material spacers for the gate structure; and annealing the etched amorphous semiconductor layer to form a crystallized semiconductor layer, whereby dopants are distributed more evenly throughout the crystallized semiconductor layer than in conventional ion implantation methods and whereby the barrier material spacers and silicide layer prevent gate rounding effect.

2. The method of claim 1, wherein the amorphous semiconductor layer includes silicon.

3. The method of claim 2, wherein the amorphous semiconductor layer includes germanium.

4. The method of claim 3, wherein the silicide layer includes tungsten and silicon.

5. The method of claim 1, wherein the amorphous semiconductor layer is melted during the annealing step.

6. The method of claim 5, wherein the barrier material spacers include silicon nitride.

7. The method of claim 1, wherein the amorphous semiconductor layer is a 100 to 200 nm layer of amorphous silicon.

8. The method of claim 1, wherein the silicide layer is a 150 nm thick layer.

9. The method of claim 1, wherein the annealing step includes laser annealing.

10. A method of manufacturing an ultra-large scale integrated circuit including a plurality of field effect transistors disposed on a semiconductor substrate, each of the transistors having a gate structure, the method comprising steps of:

providing an amorphous silicon layer directly over a dielectric layer disposed over the substrate;

doping the amorphous silicon layer;

providing a silicide layer directly over the amorphous silicon layer;

etching the dielectric layer, the amorphous silicon layer, and the silicide layer to form preliminary gate structures;

providing nitride spacers for the preliminary gate structures; and laser annealing the etched amorphous silicon layer to form a poly crystalline layer, whereby the nitride spacers and silicide layer form a fixed container so the etched amorphous silicon layer can be melted without gate rounding effect.

11. The method of claim 10, wherein the nitride spacers step includes depositing a nitride layer over the preliminary gate structures and etching the nitride layer to leave the nitride spacers.

12. The method of claim 10, wherein the amorphous silicon layer is doped with arsenic, phosphorous, boron, or boron difluoride.

13. The method of claim 10, wherein the amorphous silicon layer includes germanium.

14. The method of claim 13, wherein the amorphous silicon layer is transformed into polycrystalline silicon after the laser annealing step.

15. The method of claim 14, wherein the laser annealing step utilizes an excimer laser.

16. A method of providing a gate structure, the method comprising:

providing an amorphous layer directly over a gate dielectric layer disposed over a substrate;

doping the amorphous layer;

providing a silicide layer directly over the amorphous layer;

selectively etching the gate dielectric layer, the amorphous layer, and the silicide layer to form a gate stack;

providing spacers for the gate stack; and laser annealing the etched amorphous layer, whereby the spacers and the suicide layer reduce gate rounding effect.

17. The method of claim 16, wherein the silicide layer is tungsten silicide.

18. The method of claim 17, wherein the amorphous layer includes silicon.

19. The method of claim 18, wherein the spacers are nitride spacers.

20. The method of claim 19, wherein the nitride spacers reduce gate rounding effect when the etched amorphous layer is melted during the annealing step.

* * * * *

UNITED STATES PATENT AND TRADEMARK OFFICE
CERTIFICATE OF CORRECTION

PATENT NO.     : 6,451,644 B1                                            Page 1 of 1
DATED          : September 17, 2002
INVENTOR(S)    : Bin Yu It is certified that error appears in the above-identified patent and that said Letters Patent is hereby corrected as shown below:

Column 4,
Line 42, delete "suicide" and insert -- silicide --.

Signed and Sealed this

Twenty-eighth Day of January, 2003

JAMES E. ROGAN
*Director of the United States Patent and Trademark Office*